Jan. 6, 1970 D. A. WALCZAK ET AL 3,488,235

TRIPLE-EPITAXIAL LAYER HIGH POWER, HIGH SPEED TRANSISTOR

Filed April 25, 1967

United States Patent Office 3,488,235
Patented Jan. 6, 1970

3,488,235
TRIPLE-EPITAXIAL LAYER HIGH POWER, HIGH SPEED TRANSISTOR

Donald A. Walczak, New Alexandria, and Peter J. Kannam, Greensburg, Pa., assignors to Westinghouse Electric Corporation, Pittsburgh, Pa., a corporation of Pennsylvania Filed Apr. 25, 1967, Ser. No. 633,488
Int. Cl. H01l 7/44, 7/50, 11/02
U.S. Cl. 148—33.5 6 Claims

ABSTRACT OF THE DISCLOSURE

This invention provides a high power, high speed transistor comprising three epitaxial layers of semiconductor material grown on a substrate surface at least 1 inch in diameter. The chemical etching of the large area of the substrate upon which the epitaxial layers are grown and the growth of each of the three epitaxial layers is accomplished in one continuous process. Each epitaxial layer is grown to a desired thickness and has a specific type of semiconductivity as well as a preferred level of impurity concentration.

BACKGROUND OF THE INVENTION

Field of the invention

Figure 1:
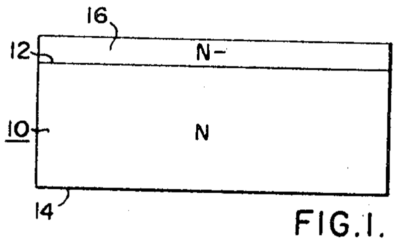

This invention relates to a triple-epitaxial layer high power, high speed transistor and a process for producing the same.

Description of the prior art

High power, high speed transistors require stringent controls during manufacture. Multi-diffusion processing enables one to manufacture such devices but fails to produce a device wherein the regions of different type semiconductivity have a minimum thickness for the electrical characteristic desired and are free of contaminants and crystal lattice defects. Prior art devices which combined one or more diffusion processes with at least one epitaxial growth process most often produce p-n junctions which are not well defined and also includes stacking faults which prevent the employment of the device as a high power, high speed transistor.

Epitaxial growth for large area semiconductor devices requires stringent substrate material preparation and selection. Heavy metal impurities such as aluminum and iron contamination from the slicing and lapping operations must be removed prior to chemical polishing. These impurities if allowed to remain act as sites for polycrystalline inclusions during epitaxial growth operations. Special handling and loading procedures are followed to prevent mechanical damage and impurity contamination from the environment. Each epitaxial growth layer of material requires a separate individual furnace run. Also the susceptor which supports the substrates is usually made of graphite and has to be cleaned and coated with a good grade of silicon carbide to effectively seal the susceptor and prevent any contamination of the epitaxially grown material from the impurities which are present in the graphite susceptor.

Prior art high power transistors, as a result of repeated handling and loading procedures, normally have a stacking fault count of approximately 100 to 200 per square centimeter.

SUMMARY OF THE INVENTION

In accordance with the present invention and attainment of the foregoing objects, there is provided a high power, high speed, three region semiconductor device comprising a body of semiconductor material, the body having a major top surface, a first type semiconductivity, and a resistivity of from 0.001 ohm-centimeter to 0.1 ohm-centimeter; a first epitaxial layer of semiconductor material disposed on the major top surface, the first epitaxial layer having the same type semiconductivity as the body, a thickness of from 12 to 20 microns, and a resistivity of from 8 to 12 ohm-centimeters; a second epitaxial layer of semiconductor material disposed on the first epitaxial layer, the second epitaxial layer having a second type semiconductivity, a thickness of from 3 to 5 microns, and a resistivity of from 0.1 to 0.2 ohm-centimeter; a first p-n junction formed at the interface between the first and the second epitaxial regions, a third epitaxial layer of semiconductor material disposed on the second epitaxial layer, the third epitaxial layer having the same type semiconductivity as the body and the first epitaxial layer, a thickness of from 3 to 4 microns, a resisitivity of from 0.005 to 0.01 ohm-centimeter, and a predetermined peripheral length; and a second p-n junction formed at the interface between the second and the third epitaxial layers.

An object of this invention is to provide a high power, high speed transistor wherein each of three suitably doped epitaxial layers form the collector and the base and the emitter of the transistor.

Another object of this invention is to provide a 100 amp high power, high speed transistor wherein the collector, the emitter and the base each are formed from a suitably doped epitaxial layer of semiconductor material.

Another object of this invention is to provide a process for making high power, high speed semiconductor devices incorporating reduced handling and loading procedures to minimize accidental contamination of the devices.

A further object of this invention is to provide a process for continuously growing three epitaxial layers of semiconductor material on a substrate wherein the epitaxial layers are free of defects and the resulting product has a low stacking fault count.

A further object of this invention is to provide a process for making a semiconductor device having three epitaxial grown layers of semiconductive material free of defects and having a low stacking fault count grown on a substrate wherein the substrate surface upon which epitaxial growth occurs is cleaned and the epitaxial layers are grown and suitably doped in one continuous furnace run.

Other objects of this invention will, in part, be obvious and will, in part, appear hereinafter.

DRAWINGS

For a better understanding of the nature and objects of this invention, reference should be had to the following drawings, in which:

FIGURES 1 through 4 are views in cross-section of a body of a semiconductor material being processed in accordance with the teachings of this invention.

Figure 6:
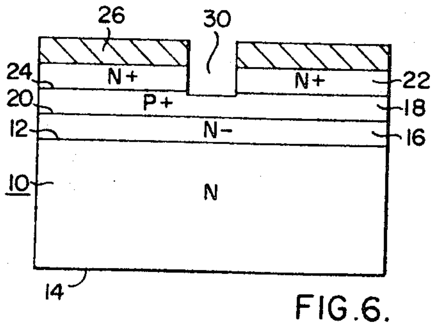
Figure 5:
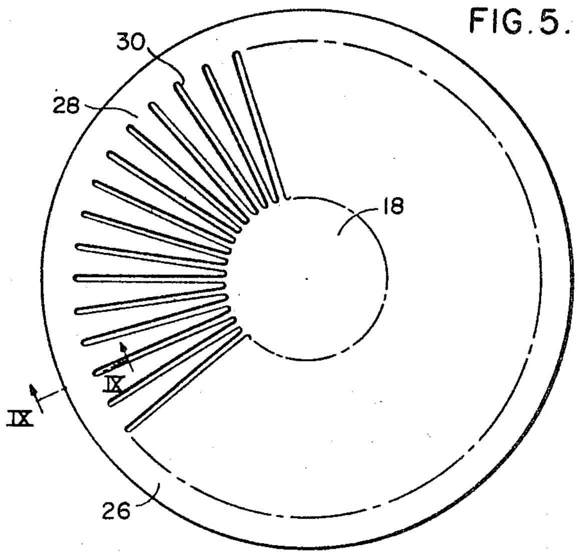
Figure 7:
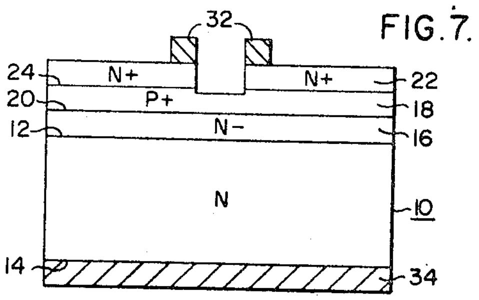
Figure 8:
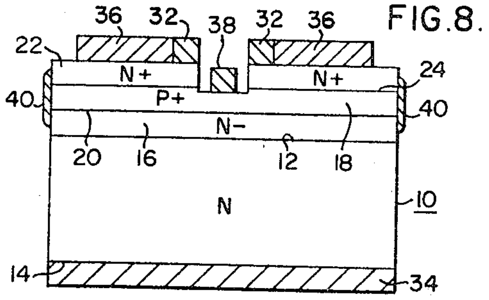
Figure 9:
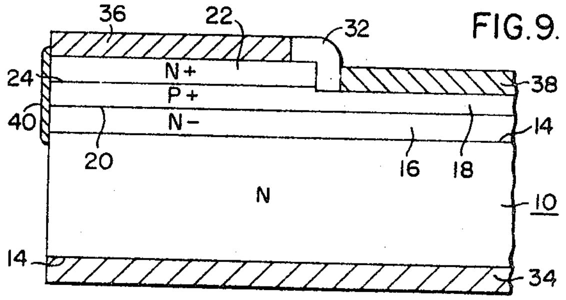

FIG. 5 is a top view of a semiconductor device showing a preferred emitter edge design; and FIGS. 6 through 8 are cross-sectional views of the body of semiconductor material being processed further in accordance with the teachings of this invention; and FIG. 9 is a cross-sectional view of a portion of the body and taken on the line IX—IX of FIG. 5 after the body has been completely processed in accordance with the teachings of this invention.

With reference to FIGURE 1 a body 10 of semiconductor material is prepared by suitable means such, for example, as by polishing and lapping to parallelism two major opposed surfaces 12 and 14.

The body 10 after processing, and before contouring to a specific emitter design, is suitable for use in any high power, high speed transistor. The amperage rating of such a high power, high speed transistor is determined by the bulk of the emitter region and the emitter edge length.

In order to more particularly describe the invention, and for no other purpose, the invention will be further described with particular reference to the making of a 100 ampere device. We have determined that for a high power, high speed transistor of 100 amperage rating, an emitter edge length of approximately 21 inches is required. This emitter edge length actually will enable one to produce some transistors capable of up to approximately 150 amperage rating. To achieve an emitter having an emitter edge length of approximately 21 inches, the body 10 preferably has a minimum diameter of approximately 1 inch for the surface 12.

The body 10 is chemically polished to remove work damage caused by the slicing of the body 10 from a suitable stock of raw material and to provide a surface conducive to defect free epitaxial growth. Approximately 2.5 to 3.0 mils are therefore removed from each surface 12 and 14 of the body 10 by the polishing and lapping operations.

The body 10 comprises a suitable semiconductor material such, for example, as silicon, silicon carbide, germanium, compounds of Group III and Group V elements and compounds of Group II and Group VI elements. Preferably the body 10 comprises silicon and is 6 mils in thickness after polishing and lapping.

The body 10 of silicon has a resistivity of from 0.001 ohm-centimeter to 0.1 ohm-centimeter. Preferably, the body 10 has a resistivity of 0.01 ohm-centimeter and is of an n-type semiconductivity.

The body 10 is placed in a horizontal epitaxial reactor furnace and heated to a temperature of from 1000° C. to 1200° C. A temperature of 1175° C.±5° is preferred. Dry filtered hydrogen is provided as the furnace atmosphere for the body 10. Pure gaseous hydrogen chloride is caused to flow through the furnace and over at least the surface 12 of the body 10. The flow is continued for approximately 10 minutes to remove any residual work damage from the preparation and handling procedures. Additionally this hydrogen chloride treatment assures a crystal lattice match for subsequent epitaxial growth. This etching process is desirable to assure that the finished device will have the optimum desired electrical properties required for high power, high speed transistors.

After treating the body 10 with hydrogen chloride, the reactor furnace temperature is maintained and the furnace is flushed with hydrogen for approximately 5 minutes. The flushing with hydrogen clears the furnace of any chloride by-products which could act as nucleation sites on the surface 12 during subsequent epitaxial growth processes.

Upon conclusion of flushing the furnace with hydrogen, the furnace temperature is retained at the same temperature. A gaseous reactant mixture of hydrogen, a silicon halide such, for example, as silicon tetrachloride, and a suitable dopant, such, for example, as arsine or phosphine, is caused to flow through the reactor and across the surface 12 of the body 10 to produce a growth of $n^-$ semiconductivity material on the surface 12. The flow of the gaseous mixture is controlled to produce an epitaxial growth of doped silicon from the reactant gas mixture at a rate of approximately 1 micron per minute. The process is continued until an epitaxial layer 16 of doped silicon, from 12 to 20 microns in thickness has been grown on the surfaces 12. A thickness of 20 microns is preferred.

The resistivity of the epitaxial layer 16 is from 8 to 12 ohm-centimeters. A resistivity of 10 ohm-centimeters is preferred. The layer 16 preferably functions as the collector region for the final transistor device.

Figure 2:
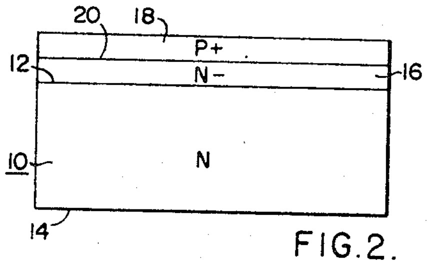

Referring now to FIG. 2, the reactor furnace is again flushed with pure hydrogen for approximately 5 minutes to again clear the furnace of residual by-products. The temperature of the furnace is maintained at the same previous temperature. A reactant gas mixture is then caused to flow through the reactor furnace over the body 10. The reactant gas mixture consists of hydrogen, a silicon halide—the same or a different halide from the one previously employed—and a suitable dopant material such, for example, as diborane to produce an epitaxial growth of material having a $p^+$ semiconductivity on the layer 16.

The reactant gas mixture is controlled to produce an epitaxial growth of doped silicon at a rate of approximately 1 micron per minute. The dopant material is suitably controlled to produce a desired level of resistivity of from 0.1 to 0.2 ohm-centimeter in the epitaxial growth. A resistivity of 0.1 ohm-centimeter is preferred. The process is continued until a layer 18 of epitaxial $p^+$ silicon 3 to 5 microns in thickness has been grown on the layer 16 of $n^-$ epitaxial silicon. A preferred thickness is 3 microns. A p-n junction 20 is formed at the interface between the two layers 16 and 18.

Upon completion of the epitaxial growth of layer 18, the furnace is flushed again with hydrogen for a sufficient time to cleanse the furnace of reactant products from the previous growth process.

Figure 3:
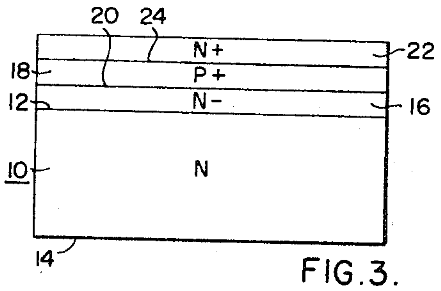

With reference to FIG. 3, a reactant gas mixture consisting of hydrogen, a silicon halide, such, for example, as silicon tetrachloride, and a suitable dopant material to produce $n^+$ semiconductivity silicon is introduced into the furnace and caused to flow over the body 10. Suitable dopant materials are phosphine and arsine.

The process is continued at a rate of epitaxial growth of approximately 1 micron per minute until a layer 22, from 3 to 4 microns in thickness has been grown on the layer 18. The layer 22 of epitaxially grown silicon has a resistivity of from 0.005 to 0.01 ohm-centimeter and a preferred resistivity of 0.01 ohm-centimeter. A p-n junction 24 is formed at the interface between the layers 18 and 22. The body 10 with its epitaxial growth layers 16, 18 and 22 is then cooled and removed from the furnace.

Figure 4:
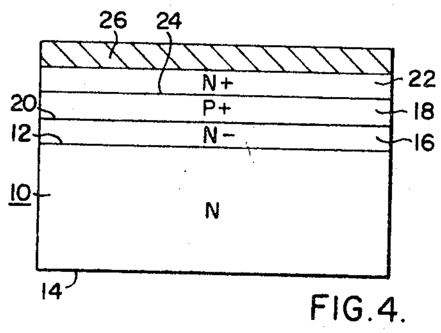

With reference to FIG. 4, the body 10 is placed in another furnace. A layer 26 of silicon oxide, approximately 5,000 to 10,000 angstroms in thickness, is grown on the layer 22. The layer 26 results from the depositing of a layer of silicon from the thermal reduction of a gaseous mixture of hydrogen and a silicon halide and oxiding the resulting layer of silicon in an atmosphere of oxygen saturated with water passing through the furnace above the body 10 at a temperature of from 1000° C. to 1100° C. for approximately 1 hour. A temperature of 1000° C.±10° C. is preferred.

With reference to FIGS. 5 and 6, a suitable photosensitive masking material is applied on the surface of the layer 26. The preferred design of an emitter 28 having an emitter edge length of approximately 21 inches is laid out on the surface of the silicon oxide layer 26 and exposed to light in a similar manner as one would make a print from a photograph negative. The light source hardens the photosensitive masking material in those areas which will protect the material of the oxide beneath them. The unhardened photosensitive material is washed away to expose selected areas of the surface of the layer 26.

The masked silicon oxide layer 26 is then exposed to a slow etching solution such, for example, as a solution of 8 parts nitric acid, 3 parts acetic acid and 1 part hydrochloric acid. The undesired portion of the layer 26 is etched away, to expose a selective portion of the layer 22. The processed body 10 is then rinsed in water and placed in boiling trichloroethylene to remove the masking material.

A solution of 15 parts nitric acid, 5 parts acetic acid and 3 parts hydrofluoric acid is then applied to, and attacks and chemically etches the material comprising the exposed surface of the layer 22. The etching process is continued until all of the exposed portions of the layer 22 as well as about 1 micron thickness of material of the layer 18 immediately beneath the etched portion of layer 22 has been removed.

Referring now to FIG. 7 and employing the same, or similar photosensitive masking materials and techniques all of the remaining layer 26 of silicon oxide except for a preferred region 32 of silicon oxide which is retained on each side of the etched groove in the epitaxial layers 18 and 22 is removed by chemical etching. The preferred region 32 of silicon oxide is used to subsequently help electrically isolate the regions of different type semiconductivities of the layers 18 and 22.

An electrical contact 34 is mounted on the bottom surface 14 of the body 10. The contact 34 comprises a material selected from the group consisting of molybdenum, tungsten, tantalum and base alloys thereof. A preferred material is molybdenum.

The contact 34 may be mounted on the surface 14 by any suitable solder such, for example, as by an ohmic solder consisting of 96 parts silver, 3 parts lead and one part antimony.

With reference to FIGURE 8, there is shown the body 10 after electrical contacts 36 and 38 have been mounted on respective layers 22 and 18. The contacts 36 and 38 comprise any suitable electrically conductive metal, such for example as aluminum.

Preferably, the contacts 36 and 38 are deposited on the layers 22 and 18 by vacuum evaporation deposition techniques. Suitable masking is required to orient the contacts on the respective surfaces. Contact material inadvertently deposited on unwanted surface areas is removed by selective etching. All extraneous contact metal should be removed to prevent accidental shorting between regions of different type semiconductivity. The preferred aluminum contacts 36 and 38 are alloyed with the material comprising the layers 22 and 18 by heating the substrate and its deposited contacts 36 and 38 to a temperature of approximately 600° C. for from one to two minutes.

All the exposed outer peripheral ends of the p-n junctions 20 and 24 are suitably treated to remove impurities and the like which may degenerate the junctions 20 and 24 on their outer periphery. One suitable means is to sandblast the peripheral edges of the p-n junctions 20 and 24. The p-n junctions 20 and 24 then are chemically etched and polished. To stabilize these treated p-n junctions 20 and 24, a suitable protective coating 40, such, for example, as alizarin, is applied over the etched and polished exposed portions of the p-n junctions 20 and 24.

With reference to FIGURE 9, there is shown an enlarged view of a portion of the resulting high power semiconductor device having the preferred electrical emitter arrangement. The enlarged view is the section IX—IX of FIG. 5.

The results of an electrical evaluation of a typical manufacturing run of 17 transistors made in accordance with this invention is tabulated in the following table.

| Unit No. | $V_{CEO}$ V/10 ma. | $V_{CBO}$ V/10 ma. | $V_{BE}$ V/10 ma. | $V_{EB}$ V/10 ma. | $h_{FE}$ 2 amps |
|---|---|---|---|---|---|
| 1 | 160 | 165 | .7 | .8 | 12 |
| 2 | 80 | 100 | .5 | .5 | 10 |
| 3 | 40 | 40 | .7 | .7 | 12 |
| 4 | 160 | 170 | .8 | 1.5 | 20 |
| 5 | 160 | 160 | 1 | 20 | 20 |
| 6 | 80 | 80 | 5 | 30 | 35 |
| 7 | 100 | 105 | 12 | 35 | 40 |
| 8 | 150 | 150 | 1 | 20 | 22 |
| 9 | 140 | 140 | 10 | 30 | 25 |
| 10 | 120 | 120 | 2 | 20 | 25 |
| 11 | 100 | 100 | 2 | 25 | 25 |
| 12 | 130 | 130 | 7 | 35 | 28 |
| 13 | 160 | 170 | 7 | 12 | 28 |
| 14 | 140 | 140 | 2 | 8 | 28 |
| 15 | 200 | 200 | 2 | 14 | 28 |
| 16 | 140 | 140 | 15 | 20 | 28 |
| 17 | 130 | 130 | 20 | 30 | 28 |

Where: $V_{CEO}$=Collector to emitter breakdown voltage; $V_{CBO}$=Collector to base breakdown voltage; $V_{BE}$=Base to emitter voltage; $V_{EB}$=Emitter to base voltage; $h_{FE}$=Current gain.

The results repeatedly obtained show that these high power, high speed transistors have good electrical characteristics. All units exhibited good voltage and current gain.

Physical examination of the units disclosed the epitaxial layers to be free of defects such, for example, as poly inclusions and tetrahedrals. This was true even when the impurity and concentration of the layers grown were as high as $10^{19}$ atoms per cubic centimeter. The stacking fault count obtained was only 8 to 20 per square centimeter. This compares quite favorably with stacking fault counts of 100 to 200 per square centimeter which is normal for commercially procured epitaxial products.

The good electrical characteristics of these transistors can be attributed to the in situ deposit of the p-n junctions. This virtually eliminates any handling required in the junction formation or exposure to a contaminating atmosphere. Accidental contamination from normal handling required in prior art techniques is eliminated and results in clean substantially defect free junctions and surfaces.

High power, high speed transistors made in accordance with the teachings of this invention are particularly suitable for use in compression bonded encapsulated electrical devices wherein an electrical lead is retained in a good electrically conductive relationship with each of the electrical contacts 34, 36 and 38 solely by resilient force means.

While the invention has been described with reference to particular embodiments and examples, it will be understood of course, that modifications, substitutions and the like may be made therein without departing from its scope.

What is claimed is:

1. A high power, high speed, three region semiconductor device comprising:

(1) a body of semiconductor material, said body having a major top surface, a first type semiconductivity, and a resistivity of from 0.001 ohm-centimeter to 0.1 ohm-centimeter;

(2) a first epitaxial layer of semiconductor material disposed on said major top surface, said first epitaxial layer having the same type semiconductivity as said body, a thickness of from 12 to 20 microns, and a resistivity of from 8 to 12 ohm-centimeters;

(3) a second epitaxial layer of semiconductor material disposed on said first epitaxial layer, said second epitaxial layer having a second type semiconductivity, a thickness of from 3 to 5 microns, and a resistivity of from 0.1 to 0.2 ohm-centimeter;

(4) a first p-n junction formed at the interface of said first and said second epitaxial layers;

(5) a third epitaxial layer of semiconductor material disposed on said second epitaxial layer, said third epitaxial layer having the same type semiconductivity as said body and said first epitaxial layer, a thickness of from 3 to 4 microns, a resistivity of from 0.005 to 0.01 ohm-centimeter and a predetermined peripheral length; and (6) a second p-n junction formed at the interface of said second and said third epitaxial layers.

2. The semiconductor device of claim 1 in which:

the first epitaxial layer has a thickness of 20 microns and a resistivity of 10 ohm-centimeters;

the second epitaxial layer has a thickness of 3 microns and a resistivity of 0.1 ohm-centimeter; and the third epitaxial layer has a thickness of 3 microns and a resistivity of 0.01 ohm-centimeter.

3. The semiconductor device of claim 1 in which the body of semiconductor material comprises silicon and each of said first, said second, and said third epitaxial layers comprises silicon.

4. The semiconductor device of claim 2 in which the body of semiconductor material comprises silicon having a resistivity of 0.01 ohm-centimeter and each of said first, said second, and said third epitaxial layers comprises silicon.

5. The semiconductor device of claim 3 in which the peripheral length of said third epitaxial layer is approximately 21 inches.

6. The semiconductor device of claim 4 in which the predetermined peripheral length of said third epitaxial layer is approximately 21 inches.

References Cited

UNITED STATES PATENTS

| | | | |
|---|---|---|---|
| 3,192,083 | 6/1965 | Sirtl | 148—174 |
| 3,260,624 | 7/1966 | Wiesner | 148—175 |

L. DEWAYNE RUTLEDGE, Primary Examiner

R. A. LESTER, Assistant Examiner

U.S. Cl. X.R.

148—175; 317—235